(12) United States Patent
Philofsky

(10) Patent No.: US 7,245,477 B2
(45) Date of Patent: Jul. 17, 2007

(54) DECOUPLING CAPACITOR AND METHOD

(75) Inventor: Elliot Malcolm Philofsky, Colorado Springs, CO (US)

(73) Assignee: Applied Ceramics Research, Colorado Springs, CO (US)

(*) Notice: Subject to any disclaimer, the term of this patent is extended or adjusted under 35 U.S.C. 154(b) by 0 days.

(21) Appl. No.: 11/214,197

(22) Filed: Aug. 29, 2005

(65) Prior Publication Data

US 2006/0034033 A1 Feb. 16, 2006

Related U.S. Application Data

(63) Continuation-in-part of application No. 10/666,595, filed on Sep. 18, 2003, now abandoned.

(51) Int. Cl.
*H01G 4/228* (2006.01)
*H01G 4/06* (2006.01)

(52) U.S. Cl. .............. 361/306.2; 361/311; 361/301.2
(58) Field of Classification Search ............ 361/301.2, 361/301.3, 301.4, 306.1, 306.2, 306.3, 308.3, 361/311, 321.1, 321.2, 321.3, 321.4, 321.5, 361/308.1
See application file for complete search history.

(56) References Cited

U.S. PATENT DOCUMENTS

| | | | | |
|---|---|---|---|---|
| 6,525,427 | B1* | 2/2003 | Duncombe et al. | 257/759 |
| 2002/0066919 | A1* | 6/2002 | Duncombe et al. | 257/306 |
| 2004/0238957 | A1* | 12/2004 | Akram et al. | 257/738 |

* cited by examiner

*Primary Examiner*—Eric W. Thomas
(74) *Attorney, Agent, or Firm*—Dale B. Halling

(57) ABSTRACT

A capacitor having a first nickel electrode. A BCTZ dielectric covers a side of the first nickel electrode. A second nickel electrode sandwiches the BCTZ.

14 Claims, 6 Drawing Sheets

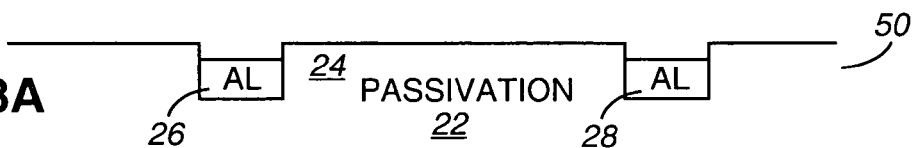
FIG. 3A
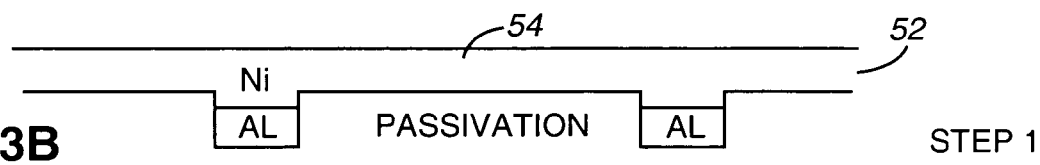
FIG. 3B  STEP 1
FIG. 3C  STEP 2
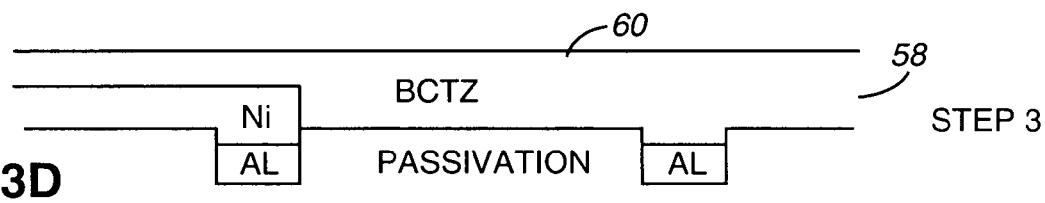
FIG. 3D  STEP 3
FIG. 3E  STEP 4
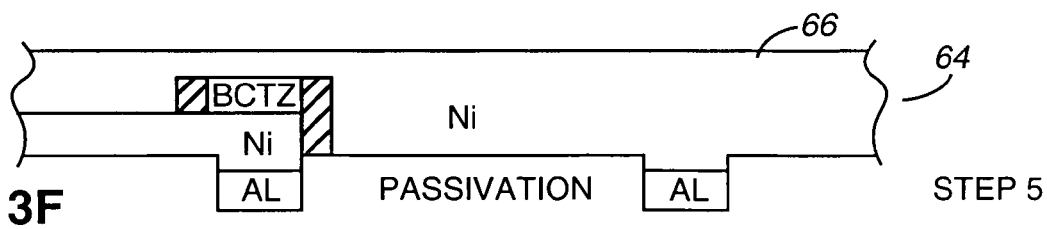
FIG. 3F  STEP 5
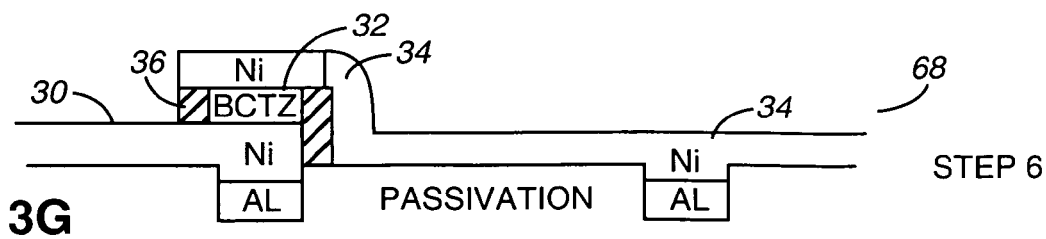
FIG. 3G  STEP 6

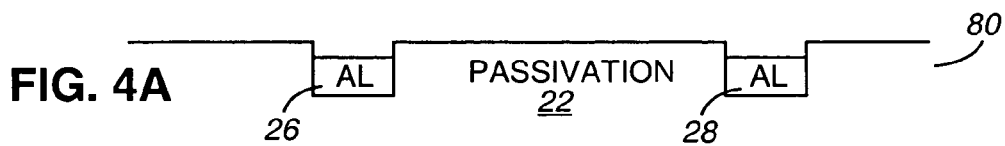
FIG. 4A
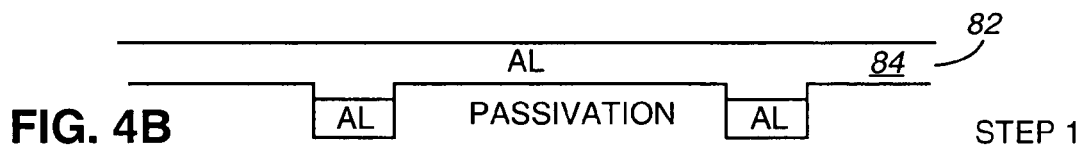
FIG. 4B    STEP 1
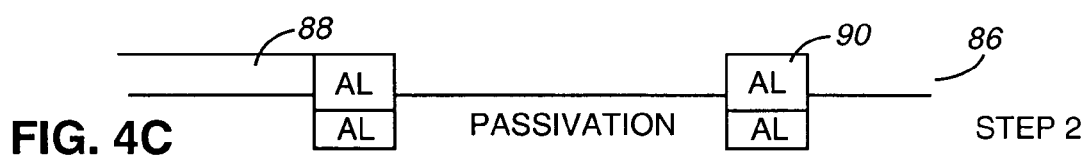
FIG. 4C    STEP 2
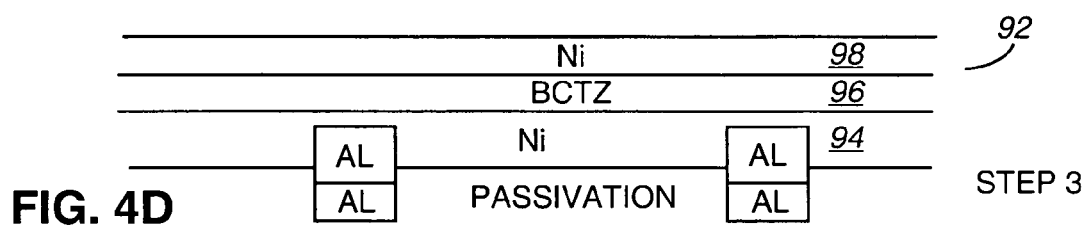
FIG. 4D    STEP 3
FIG. 4E    STEP 4
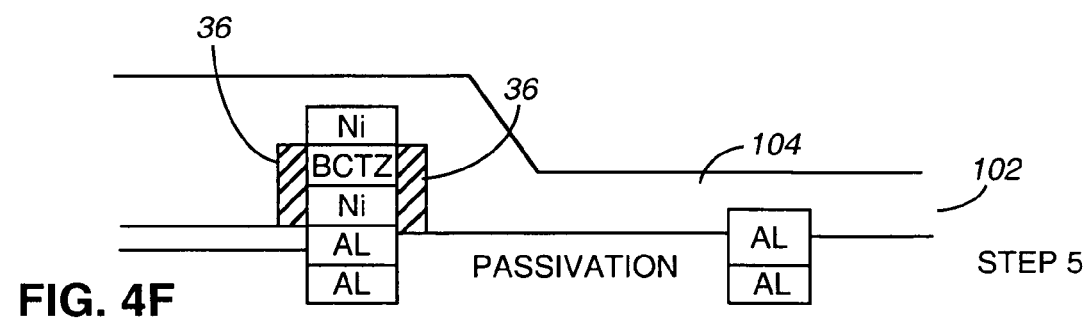
FIG. 4F    STEP 5
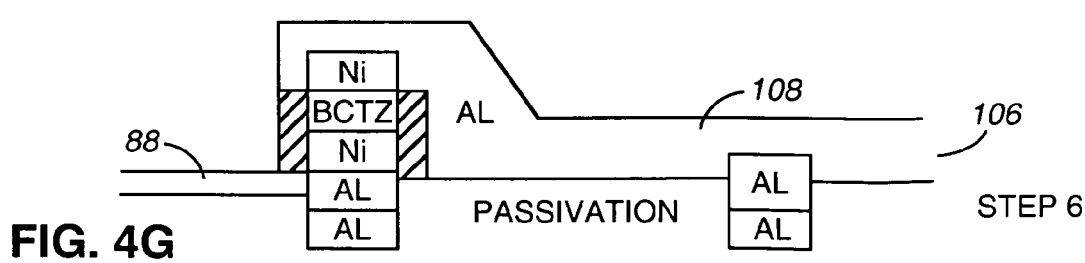
FIG. 4G    STEP 6

DECOUPLING CAPACITOR AND METHOD

RELATED APPLICATIONS

The present invention claims priority on the patent application, now abandoned, having Ser. No. 10/666,595, filed on Sep. 18, 2003, and is a continuation-in-part of said patent application.

FIELD OF THE INVENTION

The present invention relates generally to the field of capacitors and more particularly to a decoupling capacitor and method of forming the decoupling capacitor.

BACKGROUND OF THE INVENTION

Capacitors are limited by their dielectric constant. As a result, there is a constant search for dielectrics that have a high dielectric constant in order to make a smaller capacitor. In addition, it is common for the dielectric constant to vary with the voltage of the input signal. Generally, the dielectric constant is lower the higher the voltage of the input signal. As a result, it is also desirable to have a dielectric that has a dielectric constant that is essentially flat over a wide range on input voltages.

An important use of capacitors is for decoupling signals such as power and ground or input and output signals. The semiconductor industry requires numerous decoupling capacitors for each integrated circuit. Present decoupling capacitors are placed on circuit boards between leads off the integrated circuit. For high frequency circuits, the distance between the leads on the integrated circuit and the capacitor results in inductance that limits the effectiveness of the decoupling capacitor. In addition, the discrete capacitors used as the decoupling capacitors add cost and manufacturing complexity.

Thus there exists a need for an improved capacitor that may be used as a decoupling capacitor for integrated circuits.

SUMMARY OF INVENTION

A capacitor that overcomes the above referenced problems has a first nickel electrode. A crystalline BCTZ (BaCaTiZrO$_3$) dielectric covers a side of the first nickel electrode. The BCTZ is deposited at a temperature of less than 450 C. A second nickel electrode sandwiches the BCTZ. In one embodiment, the BCTZ contains eighty eight to one hundred atoms of barium for every twelve to zero atoms of calcium. The BCTZ contains eighty two to ninety atoms of titanium for each ten to eighteen atoms of zirconium.

In one embodiment, the first nickel electrode is adjacent to an aluminum metalization on an integrated circuit. In one aspect of the invention, the second nickel lead is electrically connected to a second aluminum lead on the integrated circuit. In another aspect of the invention, the second nickel metalization forms the base for solder to be reflowed to form a bump.

In one embodiment, a decoupling capacitor for an integrated circuit has a first nickel electrode coupled to an electrical lead of the integrated circuit. A dielectric is applied to the first nickel electrode. A second nickel electrode is applied to the dielectric. The second nickel electrode is attached to a second electrical lead of the integrated circuit.

In one embodiment, the dielectric is BCTZ. In another embodiment, a portion of the second nickel electrode is deposited on a passivation layer of the integrated circuit.

In one embodiment, an insulator is applied to an edge of the BCTZ. In one aspect of the invention, the insulator is applied to a portion of the first nickel electrode.

In one embodiment, a layer of aluminum is applied over the second nickel electrode. In another embodiment, a wire lead is attached to the layer of aluminum.

In one embodiment, a method of making a capacitor, includes the steps of applying a first nickel electrode to an electrical lead of an integrated circuit. Next a dielectric is applied to the first nickel electrode. Then a second nickel electrode is applied to the dielectric. In one embodiment, the second nickel electrode is coupled to a second electrical lead of the integrated circuit. In another embodiment, a first nickel layer is etched to form the first nickel electrode.

In one embodiment, a BCTZ material is applied as the dielectric. Next, an insulative layer is applied that covers a portion of the first nickel electrode and the dielectric. In one embodiment, the first nickel electrode, the dielectric and the second nickel electrode are etched. A layer of aluminum is applied. Then the layer of aluminum is etched.

In one embodiment, a layer of aluminum is applied to the integrated circuit. The layer of aluminum is etched.

In one embodiment, a layer of titanium is applied to the integrated circuit.

BRIEF DESCRIPTION OF THE DRAWINGS

FIG. 3 is a cross sectional view of the steps used in forming a decoupling capacitor on an integrated circuit in accordance with one embodiment of the invention;

FIG. 4 is a cross sectional view of the steps used in forming a decoupling capacitor on an integrated circuit in accordance with one embodiment of the invention;

DETAILED DESCRIPTION OF THE DRAWINGS

Figure 1:
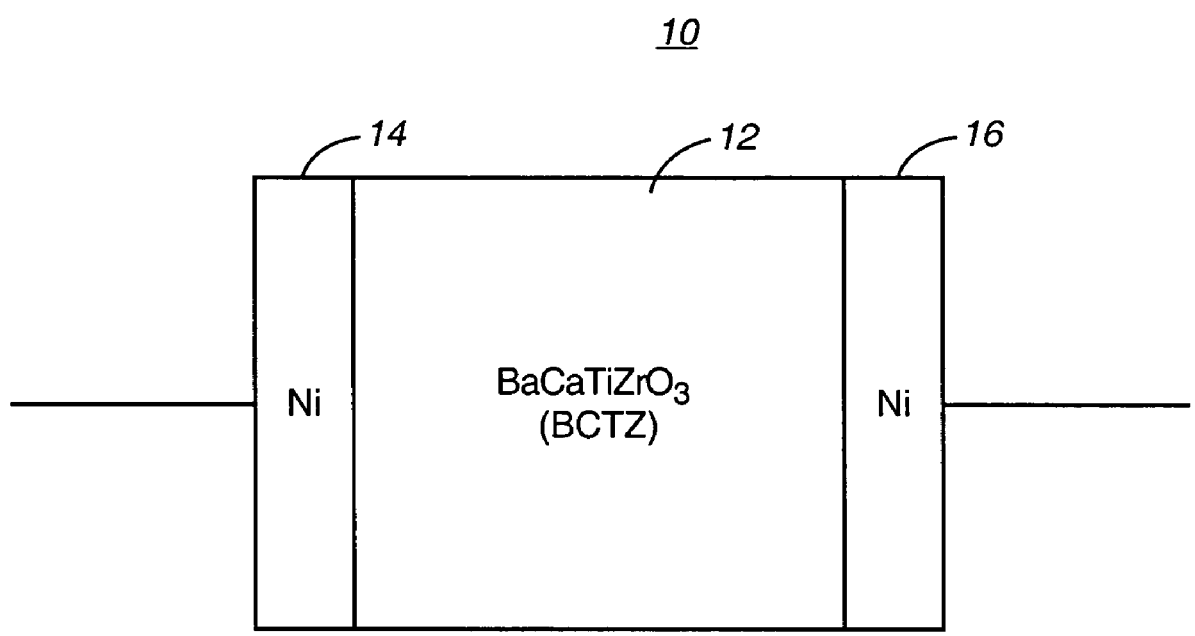
FIG. 1 is a cross sectional view of a capacitor in accordance with one embodiment of the invention.

A number of different dielectric materials have been used in capacitors. FIG. 1 is a cross sectional view of a capacitor 10 in accordance with one embodiment of the invention. The capacitor 10 uses a BaCaTiZrO$_3$ (hereinafter BCTZ) 12 dielectric material. This material has a high dielectric constant of around 75 when deposited at around 450° C. to a thickness of 20 nanometers. The high end of the temperature is limited for decoupling capacitors, because the aluminum leads become very soft above 450° C. If higher temperatures could be used, a higher dielectric constant might be possible. This results in a capacitor with capacitance of 33 femtofarads per micron squared. The ability to obtain crystalline BCTZ at such low temperatures is due to the fact that the BCTZ is in contact with nickel. Almost no other metals will allow the BCTZ to crystallize at such a low temperature. Non-crystalline BCTZ does not provide a high enough dielectric constant to form efficient decoupling capacitors.

Figure 5:
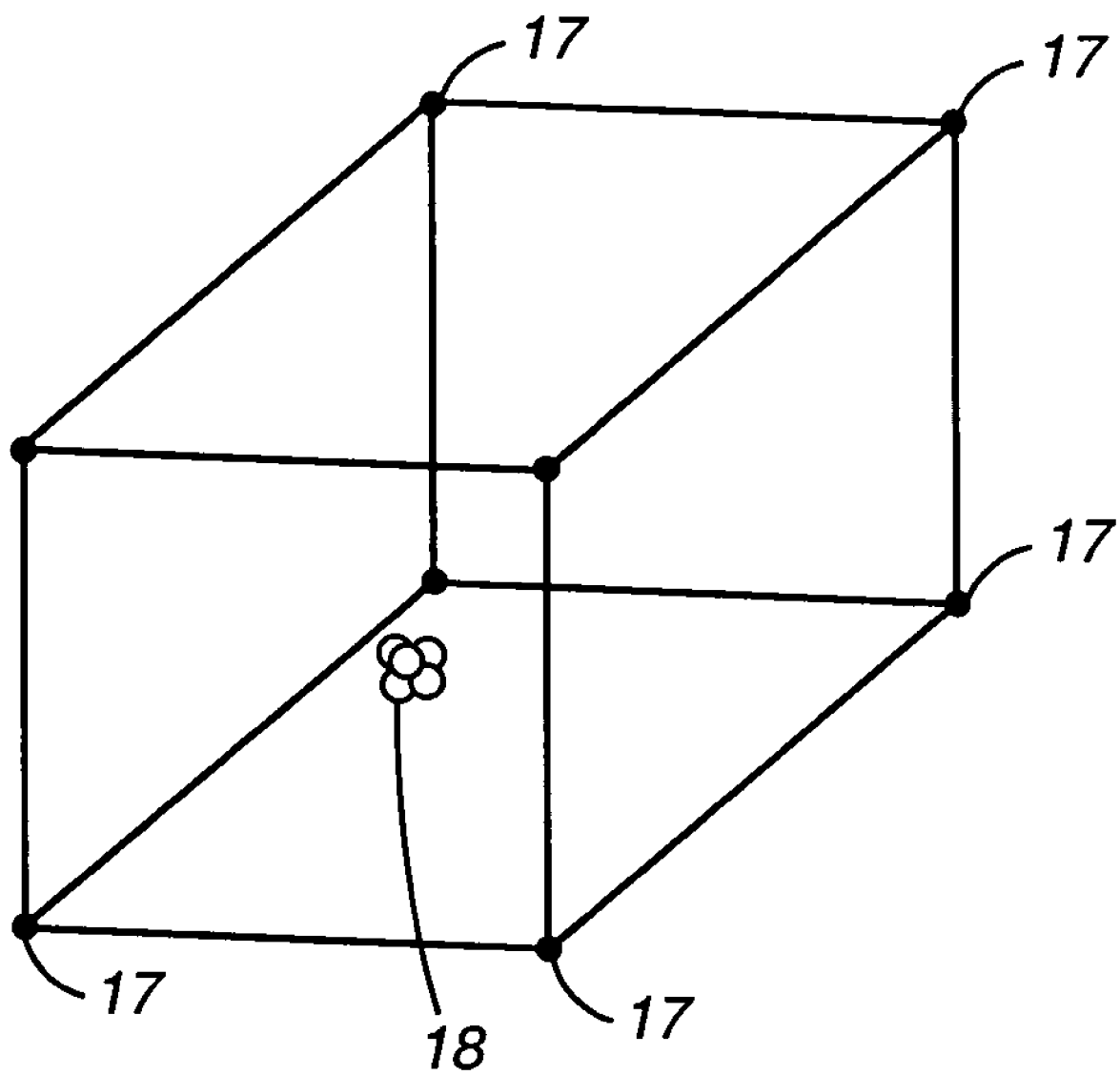
FIG. 5 is a three dimensional view of a BaCaTiZrO$_3$ in accordance with one embodiment of the invention.
Figure 6:
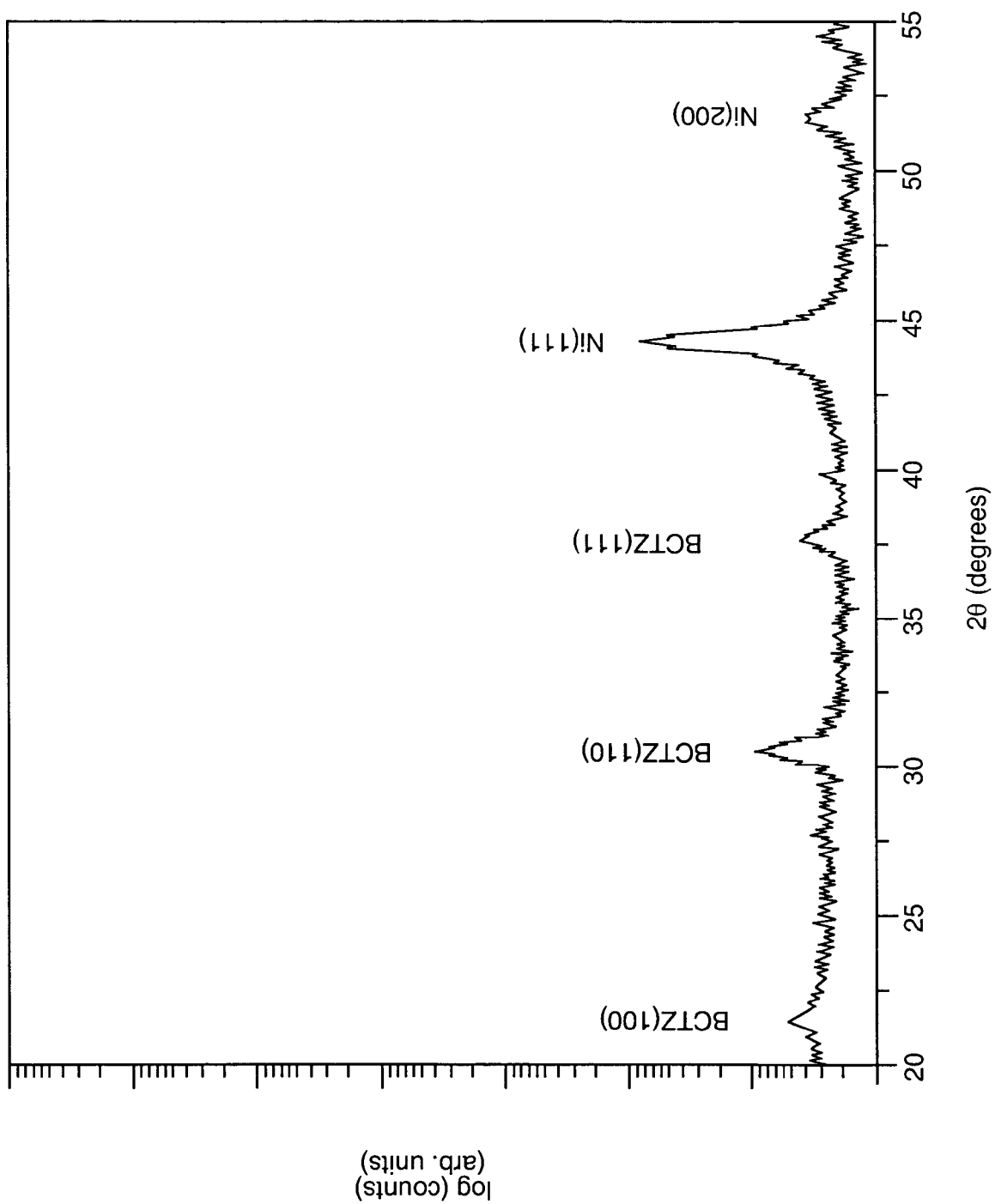
FIG. 6 is X-Ray diffraction spectra for BCTZ on nickel sputter deposited at 450 C in accordance with one embodiment of the invention.

The BCTZ's dielectric constant does not vary significantly with voltage when used with nickel electrodes. This is especially true for the voltage ranges found in integrated circuits. The capacitor 10 has a first nickel electrode 14 and a second nickel electrode 16 that sandwich the BCTZ 12. Nickel has the advantage that it may be chemically etched. This is an advantage over materials that cannot be chemically etched. In addition, nickel is less expensive than some of the other materials that have been used in the prior art as electrodes. In one embodiment, the formulation of the dielectric is $Ba_{0.96}Ca_{0.04}Ti_{0.84}Zr_{0.16}O_3$. Where the subscript 0.96 next to the barium (Ba) means there are 96 atoms of barium for each four atoms of calcium (Ca). Similarly, there are 84 atoms of titanium (Ti) for each 16 atoms of zirconium (Zr). FIG. 5 is a drawing of BCTZ molecule. The molecule is a body center cubic molecule with barium (Ba) and calcium (Ca) on the corners (A site) 17 and titanium and zirconium oxide in the center (B site) 18. In one embodiment, the barium can range between eighty eight to one hundred atoms while the calcium ranges between twelve and zero atoms. The zirconium may range between ten to eighteen atoms while the titanium ranges between ninety and eighty two atoms. In one embodiment, the titanium or zirconium, B site, is partially replaced by acceptors such as scandium (Sc), magnesium (Mg), aluminum (Al), chromium (Cr), gallium (Ga), manganese (Mn), yttrium (Y) or ytterbium (yb). In one embodiment, the acceptors range between zero and one percent of the atoms of the "B site" atoms. In one experiment, the BCTZ was doped with 0.4% scandium in another experiment the BCTZ was doped with 0.4% magnesium. FIG. 6 is X-Ray diffraction spectra for BCTZ on nickel sputter deposited at 450 C in accordance with one embodiment of the invention. This figure clearly shows the crystalline nature of the BCTZ.

Figure 2:
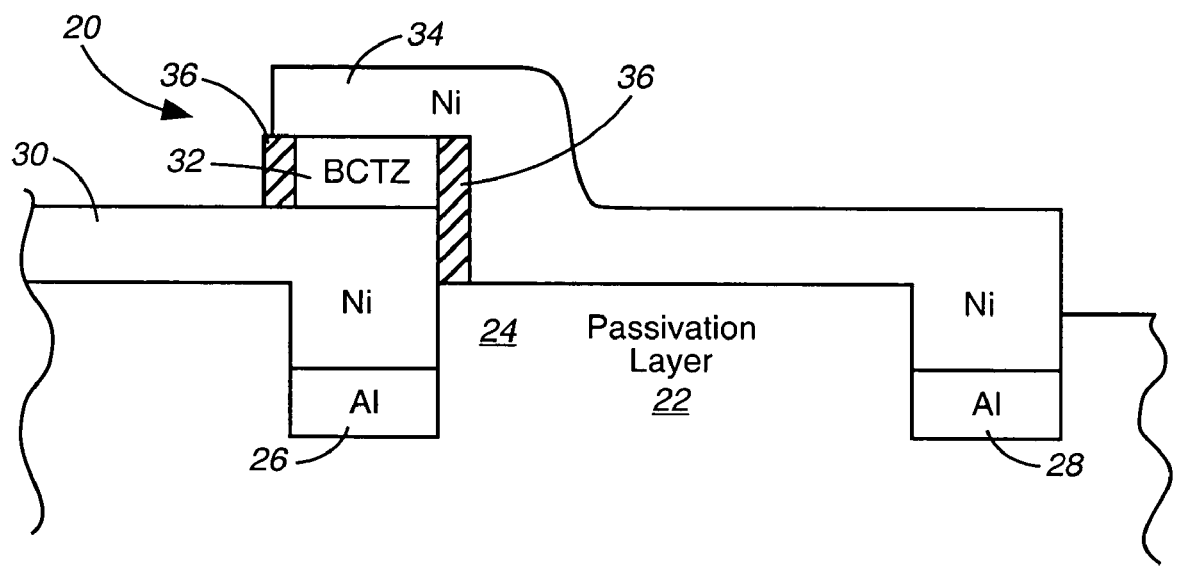
FIG. 2 is a partial cross sectional view of decoupling capacitor on a integrated circuit in accordance with one embodiment of the invention.

FIG. 2 is a partial cross sectional view of decoupling capacitor 20 on a integrated circuit 22 in accordance with one embodiment of the invention. Only the top passivation layer 24 and the aluminum electrical metallization layers 26, 28 are shown of the integrated circuit 22. A first nickel electrode 30 is electrically coupled to a first electrical lead 26 of the integrated circuit 22. A dielectric layer of BCTZ 32 is adjacent to a portion of the first nickel electrode 30. A second nickel electrode 34 sandwiches the BCTZ 32 and is electrically coupled to a second electrical lead 28 of the integrated circuit 22. An insulative layer 36 covers a portion of the BCTZ 32 and the first nickel electrode 30 to ensure that the second nickel electrode 34 does not electrically contact the first nickel electrode 30 or otherwise degrade the capacitor 20. The first nickel electrode 30 and the second nickel electrode 34 may form the base for solder to be reflowed to form a bump for a surface mount integrated circuit. With some slight variations the electrode may also be used with a wire bonded integrated circuit. In one embodiment, a layer of titanium may be applied to the passivation layer 24 before any nickel is applied. The titanium may be used to provide a stronger bond to the passivation layer. This decoupling capacitor 20 is formed right on the integrated circuit. There is almost no space between the electrical lead 26 and the capacitor. As a result, the decoupling capacitor 20 is significantly more effective at removing jitter at high frequencies than prior art discrete capacitors. In addition, the decoupling capacitor 20 can be formed using standard photo etching techniques. This lowers the cost and complexity of adding the decoupling capacitor.

FIG. 3 is a cross sectional view of the steps used in forming a decoupling capacitor on an integrated circuit in accordance with one embodiment of the invention. The steps shown here are for a surface mount integrated circuit. At the top 50 of the figure a portion of the integrated circuit 22 is shown. The same reference numerals used with respect to FIG. 2 will be used here. The first step 52 is to apply a layer of nickel 54. The nickel 54 is etched in the second step 56 to form the first nickel electrode 30. At step three 58 a layer of BCTZ 60 is applied. At step four 62 the BCTZ is etched to form the BCTZ dielectric 32 of the capacitor 22. In addition, an insulative layer 36 is applied. At step five 64 a second layer of nickel 66 is applied. The nickel is etched to form the second nickel electrode 34 at step six 68. In one embodiment, the nickel may form the base for solder to be reflowed to form a pair bumps for a surface mount chip. The nickel may be applied by DC (direct current) sputtering. The BCTZ may be applied by RF (radio frequency) sputtering. The etching may be a standard chemical photo etching process.

FIG. 4 is a cross sectional view of the steps used in forming a decoupling capacitor on an integrated circuit in accordance with one embodiment of the invention. The steps shown here are for a wire bonded integrated circuit. At the top 80 of the figure is shown a portion of the integrated circuit 22. The first step 82 is to apply a layer of aluminum 84 over the passivation layer of the integrated circuit 22. The aluminum is etched at step two 86 to form a pair of pads 88, 90. At step three 92 a first layer of nickel 94, a layer of BCTZ 96, and a second layer of nickel 98 is applied. At step four 100 the first layer of nickel, the layer of BCTZ and the second layer of nickel are etched to form a decoupling capacitor 20. At step five 102 another layer of aluminum 104 is applied and an insulative layer is applied. At step six 106 the second layer of aluminum is etched to from a second lead 108. The aluminum leads 88 and 108 may then be used for attaching wire bonds.

Thus there has been described a capacitor and its use as a decoupling capacitor. The capacitor has a high dielectric constant and small variations in the dielectric constant with changes in the applied voltage. When the capacitor is used as a decoupling capacitor it may be placed adjacent to an electrical lead of the integrated circuit. This increases the effectiveness of the decoupling capacitor by reducing the amount of stray inductance. In addition, the decoupling capacitor can be form right on the integrated circuit using standard chemical photo etching techniques. This reduces the costs associated with the decoupling capacitor.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A capacitor, comprising:
   a first nickel electrode electrically connected to an aluminum metallization at the bonding of an integrated circuit and applied on a passivation layer of the integrated circuit;
   a crystalline BCTZ dielectric covering a side of the first nickel electrode; and
   a second nickel electrode sandwiching the crystalline BCTZ.

2. The capacitor of claim 1, wherein the crystalline BCTZ contains from eighty eight to one hundred atoms of barium for every twelve to zero atoms of calcium.

3. The capacitor of claim 1, wherein the crystalline BCTZ contains eighty two to ninety atoms of titanium for each ten to eighteen atoms of zirconium.

4. The capacitor of claim 1, wherein the crystalline BCTZ is applied at a temperature not exceeding 450° C.

5. The capacitor of claim 1, wherein the second nickel electrode is electrically connected to a second aluminum metalization on the integrated circuit.

6. The capacitor of claim 1, wherein the thickness of the crystalline BCTZ is less than 40 nanometers.

7. A decoupling capacitor for an integrated circuit, comprising:
- a first nickel electrode coupled to an aluminum electrical metalization of the integrated circuit;
- a crystalline BCTZ dielectric applied to the first nickel electrode, wherein the thickness of the crystalline BCTZ dielectric is less than 40 nanometers; and
- a second nickel electrode applied to the dielectric and electrically attached to a second electrical lead of the integrated circuit.

8. The decoupling capacitor of claim 7, wherein a portion of the second nickel electrode is deposited on a passivation layer of the integrated circuit.

9. The decoupling capacitor of claim 7, further including an insulator applied to an edge of the BCTZ.

10. The decoupling capacitor of claim 9, wherein the insulator is applied to a portion of the first nickel electrode.

11. The decoupling capacitor of claIm 7, wherein a layer of aluminum is applied over the second nickel electrode.

12. The decoupling capacitor of claim 11, wherein a wire lead is attached to the layer of aluminum.

13. The decoupling capacitor of claim 7, wherein the BCTZ dielectric capacitor has at least a capacitance 10 femto-farads per micron squared.

14. The decoupling capacitor of claim 13, wherein the BCTZ dielectric is applied at a temperature that does not exceed 450° C.

* * * * *